US012808583B2

(12) United States Patent
Yokoya et al.

(10) Patent No.: US 12,808,583 B2
(45) Date of Patent: Nov. 24, 2026

(54) METHOD FOR OPERATING CRYOCOOLER

(71) Applicant: SUMITOMO HEAVY INDUSTRIES, LTD., Tokyo (JP)

(72) Inventors: Izuru Yokoya, Nishitokyo (JP); Takayuki Yokodo, Nishitokyo (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 231 days.

(21) Appl. No.: 18/895,405

(22) Filed: Sep. 25, 2024

(65) Prior Publication Data

US 2025/0012486 A1 Jan. 9, 2025

Related U.S. Application Data

(63) Continuation of application No. PCT/JP2023/010835, filed on Mar. 20, 2023.

(30) Foreign Application Priority Data

Mar. 28, 2022 (JP) ................................ 2022-052332

(51) Int. Cl.
*F25B 9/10* (2006.01)
*G01R 33/38* (2006.01)

(52) U.S. Cl.
CPC ............ *F25B 9/10* (2013.01); *G01R 33/3804* (2013.01)

(58) Field of Classification Search
None
See application file for complete search history.

(56) References Cited

U.S. PATENT DOCUMENTS 10,280,913 B2 5/2019 Matsui
10,704,809 B2 7/2020 Longsworth et al.
12,007,152 B2 * 6/2024 Oyama ..................... F25B 9/14
2009/0158752 A1 6/2009 Clayton et al.
2024/0384897 A1 * 11/2024 Xu .......................... H01F 1/012
2025/0116434 A1 * 4/2025 Morie ....................... F25B 9/14
2026/0063116 A1 * 3/2026 Kaneko ................... F04B 37/08
2026/0071617 A1 * 3/2026 Gotanda ................. F04B 37/08
(Continued)

FOREIGN PATENT DOCUMENTS

JP H067023 B2 1/1994
JP H06109339 A 4/1994
JP 2722731 B2 3/1998
(Continued)

*Primary Examiner* — Jenna M Maroney
(74) *Attorney, Agent, or Firm* — HEA Law PLLC

(57) ABSTRACT

A method for operating a cryocooler, in which the cryocooler includes an expander including an expander motor that is connected to a power source by a power supply cable and is capable of being driven at a power source frequency, the method includes: releasing a connection between the power source and the expander motor by the power supply cable; connecting the power source and the expander motor via an inverter; executing an accelerated cooling operation of the cryocooler in which the power source frequency is converted into an operation frequency higher than the power source frequency by the inverter and the expander motor is driven at the converted operation frequency; and removing the inverter and reconnecting the power source and the expander motor, after the accelerated cooling operation is stopped.

6 Claims, 9 Drawing Sheets

(56) References Cited

U.S. PATENT DOCUMENTS

2026/0160465 A1* 6/2026 Morie .................. F25B 49/025

FOREIGN PATENT DOCUMENTS

| | | | | |
|---|---|---|---|---|
| JP | H11281182 A | 10/1999 | | |
| JP | 2000121192 A | 4/2000 | | |
| JP | 2000292024 A | 10/2000 | | |
| JP | 2005024239 A | 1/2005 | | |
| JP | 2009150645 A | 7/2009 | | |
| JP | 2014173819 A | 9/2014 | | |
| JP | 2020515038 A | 5/2020 | | |
| WO | WO-2023189805 A1 * | 10/2023 | .............. | F25B 9/002 |

* cited by examiner

METHOD FOR OPERATING CRYOCOOLER

CROSS-REFERENCE TO RELATED APPLICATIONS

This is a bypass continuation of International PCT Application No. PCT/JP2023/010835, filed on Mar. 20, 2023, which claims priority to Japanese Patent Application No. 2022-052332, filed on Mar. 28, 2022, which are incorporated by reference herein in their entirety.

BACKGROUND

Technical Field

Certain embodiments of the present invention relate to a method for operating a cryocooler.

Description of Related Art

One of the main uses of a cryocooler is to cool a superconducting magnet. For that purpose, so-called immersion cooling in which the entire superconducting magnet is immersed in liquid helium is often used in the related art. The cryocooler is used to re-condense the vaporized liquid helium.

In general, the cryocooler may stop the cooling operation, for example, in order to receive regular maintenance, or suddenly due to a failure or some abnormality. In the immersion cooling, even when the cryocooler is stopped, the liquid helium can contribute to cooling and maintaining the temperature of an object to be cooled such as a superconducting magnet.

SUMMARY

According to an embodiment of the present invention, there is provided a method for operating a cryocooler. The cryocooler includes an expander including an expander motor that is connected to a power source by a power supply cable and is capable of being driven at a power source frequency. The method includes: releasing a connection between the power source and the expander motor by the power supply cable; connecting the power source and the expander motor via an inverter; executing an accelerated cooling operation of the cryocooler in which the power source frequency is converted into an operation frequency higher than the power source frequency by the inverter and the expander motor is driven at the converted operation frequency; and removing the inverter and reconnecting the power source and the expander motor, after the accelerated cooling operation is stopped.

DETAILED DESCRIPTION

Figure 1:
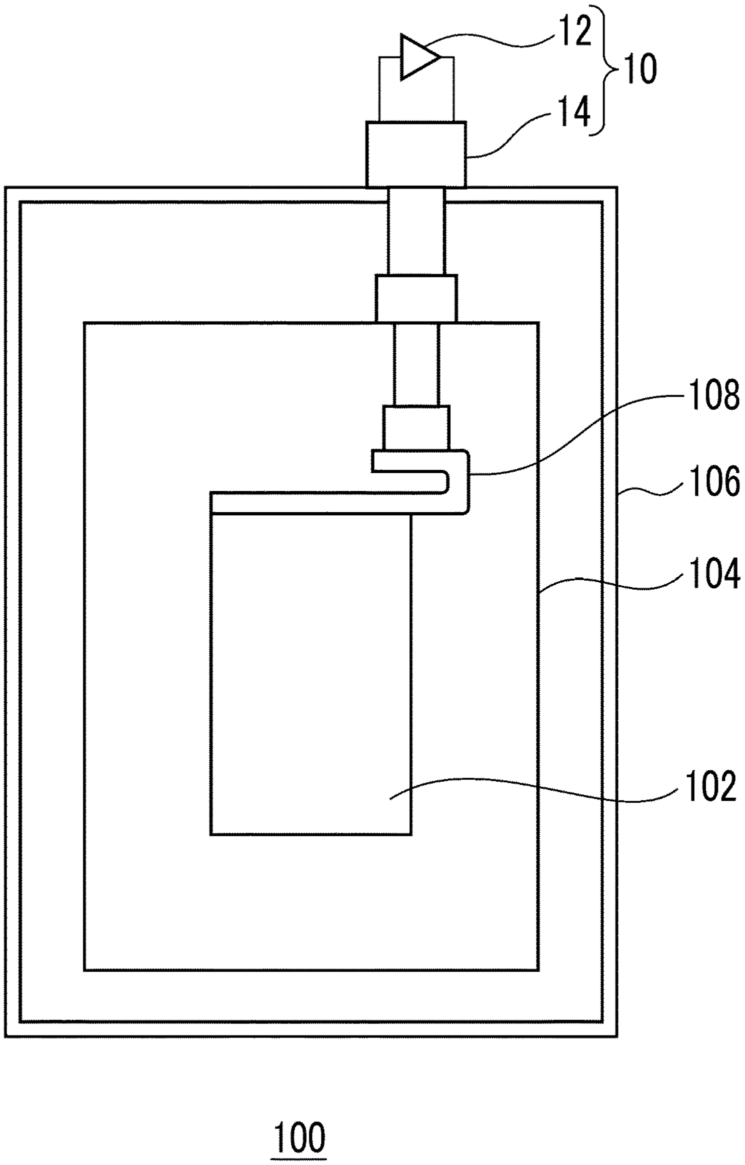
FIG. 1 is a diagram schematically showing a superconducting device according to an embodiment.

However, the immersion cooling system requires a large amount (for example, several hundred liters or more) of liquid helium. Therefore, against the background of the recent tight global helium supply and demand, research and development of a helium-saving cooling method in which the amount of liquid helium used is significantly reduced compared to the immersion cooling is being conducted. In the helium-saving cooling, a cryocooler serves as a main (or only) cooling source. Therefore, unlike the immersion cooling, the object to be cooled may be significantly heated due to input heat from the surrounding environment during the operation stop of the cryocooler. In that case, there is a concern that it may take a considerable time to re-cool to a desired cooling temperature after the operation of the cryocooler is resumed. The downtime in which the object to be cooled cannot be used is prolonged, which is undesirable.

It is desirable to provide a method for operating a cryocooler that assists in re-cooling of an object to be cooled.

Any combination of the above components or components or expressions of the present invention that are mutually replaced between methods, devices, systems, or the like are also effective as aspects of the present invention.

Hereinafter, embodiments for carrying out the present invention will be described in detail with reference to the drawings. In the description and drawings, identical or equivalent components, members, and processing are denoted by the same reference numerals, and overlapping description is omitted as appropriate. The scale or shape of each part that is shown in the drawings is conveniently set for ease of description and is not limitedly interpreted unless otherwise specified. The embodiments are exemplary and do not limit the scope of the present invention in any way. All features or combinations thereof described in the embodiments are not essential to the invention.

Figure 2:
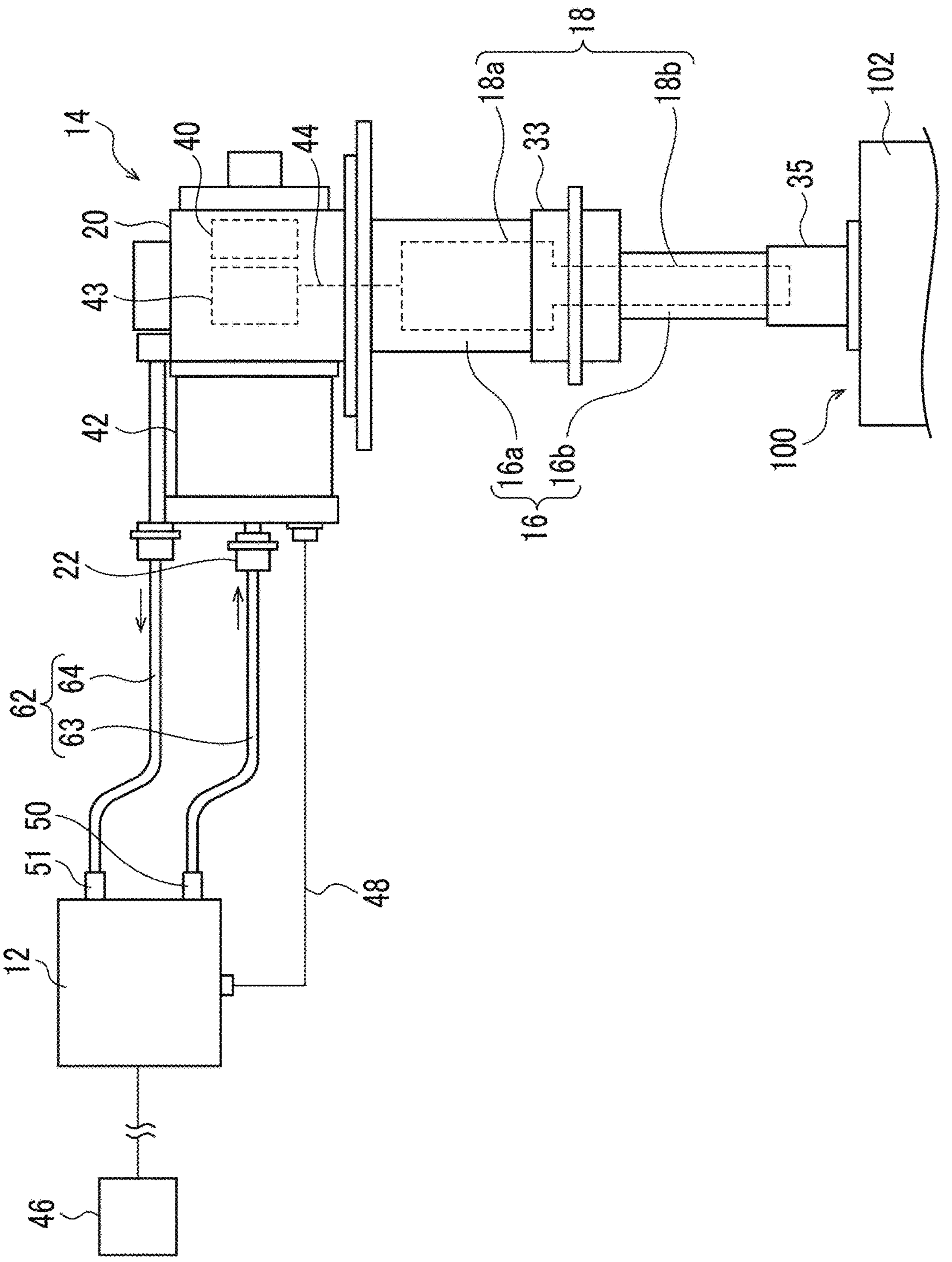
FIG. 2 is a diagram schematically showing a cryocooler according to the embodiment.
Figure 3:
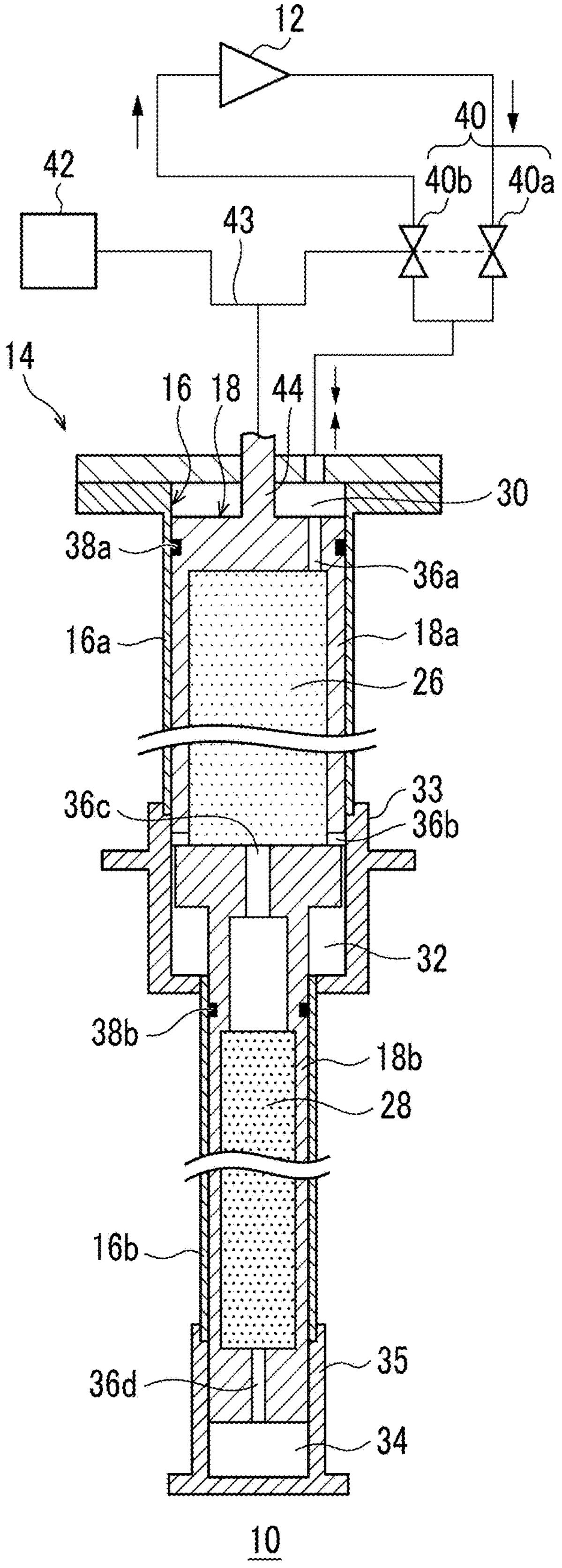
FIG. 3 is a diagram schematically showing the cryocooler according to the embodiment.

FIG. 1 is a diagram schematically showing a superconducting device 100 according to an embodiment. FIGS. 2 and 3 are diagrams schematically showing a cryocooler 10 according to the embodiment.

As shown in FIG. 1, the superconducting device 100 includes a superconducting coil 102, a heat shield 104, a vacuum vessel 106, and a cryocooler 10. In the embodiment, the superconducting device 100 configures, for example, a part of a magnetic resonance imaging (MRI) system.

The superconducting coil 102 is cooled to a cryogenic temperature equal to or lower than a critical temperature at which superconductivity is manifested by the cryocooler 10 during use. An exciting current is supplied to the superconducting coil 102 from an external power source (not shown) disposed outside the vacuum vessel 106, whereby a strong magnetic field can be generated.

The heat shield 104 is disposed around the superconducting coil 102, and is configured to thermally protect the superconducting coil 102 from radiant heat that can enter from the outside of the heat shield 104. The heat shield 104 is formed of a metal material such as copper, for example, or another material having high thermal conductivity.

The vacuum vessel 106 is an insulated vacuum vessel that provides a cryogenic vacuum environment suitable for bringing the superconducting coil 102 into a superconducting state, and is also called a cryostat. The heat shield 104 is accommodated in the vacuum vessel 106 together with the superconducting coil 102. The vacuum vessel 106 is formed of a metal material such as stainless steel, for example, or another appropriate high strength material so as to withstand ambient pressure (for example, atmospheric pressure).

As an example, the cryocooler 10 is a two-stage Gifford-McMahon (GM) cryocooler. In FIG. 2, a compressor 12 and an expander 14 that configure the cryocooler 10 are schematically shown, and in FIG. 3, an internal structure of the expander 14 of the cryocooler 10 is shown. The expander 14 is also referred to as a cold head.

The compressor 12 is disposed outside the vacuum vessel 106, and the expander 14 is installed on the vacuum vessel 106 such that a low-temperature section thereof is disposed inside the vacuum vessel 106. The compressor 12 is configured to collect a working gas of the cryocooler 10 from the expander 14, to pressurize the collected working gas, and to supply the working gas to the expander 14 again. A refrigeration cycle (for example, a GM cycle) of the cryocooler 10 is configured by the compressor 12 and the expander 14, and thus, the expander 14 can provide cryogenic cooling. The working gas is typically a helium gas. However, other suitable gases may be used. For the sake of understanding, a flow direction of the working gas is shown by an arrow in each drawing.

During the operation of the superconducting device 100, a first-stage cooling stage (for example, a first cooling stage 33 described later) of the cryocooler 10 is cooled to a first cooling temperature, for example, a temperature in a range of 30 K to 50 K, and a second-stage cooling stage (for example, a second cooling stage 35 described later) of the cryocooler 10 is cooled to a second cooling temperature lower than the first cooling temperature, for example, a temperature in a range of 3 K to 20 K (for example, about 4 K). The heat shield 104 is thermally coupled to the first-stage cooling stage of the cryocooler 10 and is cooled to the first cooling temperature. The superconducting coil 102 is thermally coupled to the second-stage cooling stage of the cryocooler 10 and is cooled to the second cooling temperature.

The superconducting coil 102 may be cooled by conduction cooling by the second-stage cooling stage of the cryocooler 10. For example, as shown in FIG. 1, the superconducting coil 102 may be physically connected to the second-stage cooling stage of the cryocooler 10 by a flexible or rigid heat transfer member 108 formed of a material having high thermal conductivity such as copper, similarly to the heat shield 104. The superconducting coil 102 may be directly coupled to the second-stage cooling stage of the cryocooler 10 without the heat transfer member 108.

Alternatively, the superconducting device 100 may be a helium-saving type device that is cooled by circulating a small amount (for example, several liters or less) of cryogenic refrigerant through the superconducting coil 102. In this case, the superconducting device 100 may include a cryogenic refrigerant circuit disposed on the surface and/or the inside of the superconducting coil 102. This cryogenic refrigerant circuit configures a superconducting coil cooling system together with the cryocooler 10. The cryocooler 10 cools the cryogenic refrigerant of the cryogenic refrigerant circuit, and the cooled cryogenic refrigerant cools the superconducting coil 102 by flowing through the cryogenic refrigerant circuit. The cryogenic refrigerant may be, for example, liquid helium or high-pressure helium gas enclosed in the cryogenic refrigerant circuit.

An exemplary configuration of the cryocooler 10 that can be used in the embodiment will be described with reference to FIGS. 2 and 3. The compressor 12 may be, for example, a scroll type, a rotary type, or another appropriate pump for pressurizing the working gas. In the embodiment, the compressor 12 is configured to discharge a fixed and constant working gas flow rate. Alternatively, the compressor 12 may be configured to allow a variable flow rate of the working gas to be discharged. For example, a cooling device such as a chiller may be attached to the compressor 12 in order to remove the compression heat that is generated by compressing the working gas.

In general, both the pressure of the working gas that is supplied from the compressor 12 to the expander 14 and the pressure of the working gas that is collected from the expander 14 to the compressor 12 are considerably higher than the atmospheric pressure, and can be called a first high pressure and a second high pressure, respectively. For convenience of description, the first high pressure and the second high pressure are also simply referred to as high pressure and low pressure, respectively. Typically, the high pressure is, for example, a pressure in a range of 2 to 3 MPa. The low pressure is, for example, a pressure in a range of 0.5 to 1.5 MPa and is, for example, about 0.8 MPa. For the sake of understanding, the flow direction of the working gas is shown by an arrow.

The expander 14 includes a cryocooler cylinder 16 and a displacer assembly 18. The cryocooler cylinder 16 guides the linear reciprocating motion of the displacer assembly 18, and forms expansion chambers (32, 34) for the working gas between itself and the displacer assembly 18. In addition, the expander 14 includes a pressure switching valve 40 that determines an intake start timing of the working gas into the expansion chamber and an exhaust start timing of the working gas from the expansion chamber.

In the present specification, in order to describe a positional relationship between the components of the cryocooler 10, for convenience, a side close to a top dead center of the axial reciprocation of the displacer is described as "upper", and a side close to a bottom dead center is described as "lower". The top dead center is the position of the displacer where the volume of an expansion space is maximized, and the bottom dead center is the position of the displacer where the volume of the expansion space is minimized. Since a temperature gradient is generated in which a temperature drops from the upper side to the lower side in the axial direction during the operation of the cryocooler 10, the upper side can be referred to as a high temperature side and the lower side can be referred to as a low temperature side.

The cryocooler cylinder 16 includes a first cylinder 16*a* and a second cylinder 16*b*. As an example, the first cylinder 16*a* and the second cylinder 16*b* are members having a cylindrical shape, and the second cylinder 16*b* has a smaller diameter than the first cylinder 16*a*. The first cylinder 16*a* and the second cylinder 16*b* are coaxially disposed, and a lower end of the first cylinder 16*a* is rigidly connected to an upper end of the second cylinder 16*b*.

The displacer assembly 18 includes a first displacer 18*a* and a second displacer 18*b*, which are connected to each other, and these displacers move integrally. As an example, the first displacer 18*a* and the second displacer 18*b* are members having a cylindrical shape, and the second displacer 18*b* has a smaller diameter than the first displacer 18*a*. The first displacer 18*a* and the second displacer 18*b* are coaxially disposed.

The first displacer 18*a* is accommodated in the first cylinder 16*a*, and the second displacer 18*b* is accommodated in the second cylinder 16*b*. The first displacer 18*a* can reciprocate in an axial direction along the first cylinder 16*a*, and the second displacer 18*b* can reciprocate in the axial direction along the second cylinder 16*b*.

As shown in FIG. 3, the first displacer 18*a* accommodates a first regenerator 26. The first regenerator 26 is formed by filling a tubular main body portion of the first displacer 18*a* with a wire mesh such as copper, for example, or another appropriate first regenerator material. An upper lid portion and a lower lid portion of the first displacer 18*a* may be provided as separate members from the main body portion of the first displacer 18*a*, and the upper lid portion and the lower lid portion of the first displacer 18*a* may be fixed to the main body by appropriate means such as fastening or welding, whereby the first regenerator material may be accommodated in the first displacer 18*a*.

Similarly, the second displacer 18*b* accommodates a second regenerator 28. The second regenerator 28 is formed by filling a tubular main body portion of the second displacer 18*b* with a non-magnetic regenerator material such as bismuth, a magnetic regenerator material such as $HoCu_2$, or another appropriate second regenerator material. The second regenerator material may be formed in a granular shape. An upper lid portion and a lower lid portion of the second displacer 18*b* may be provided as separate members from the main body portion of the second displacer 18*b*, and the upper lid portion and the lower lid portion of the second displacer 18*b* may be fixed to the main body by appropriate means such as fastening or welding, whereby the second regenerator material may be accommodated in the second displacer 18*b*.

The displacer assembly 18 forms a room temperature chamber 30, a first expansion chamber 32, and a second expansion chamber 34 inside the cryocooler cylinder 16. The expander 14 includes the first cooling stage 33 and the second cooling stage 35 for heat exchange with a desired object or medium to be cooled by the cryocooler 10. The room temperature chamber 30 is formed between the upper lid portion of the first displacer 18*a* and the upper portion of the first cylinder 16*a*. The first expansion chamber 32 is formed between the lower lid portion of the first displacer 18*a* and the first cooling stage 33. The second expansion chamber 34 is formed between the lower lid portion of the second displacer 18*b* and the second cooling stage 35. The first cooling stage 33 is fixed to the lower portion of the first cylinder 16*a* to surround the first expansion chamber 32, and the second cooling stage 35 is fixed to the lower portion of the second cylinder 16*b* to surround the second expansion chamber 34.

The first regenerator 26 is connected to the room temperature chamber 30 through a working gas flow path 36*a* formed in the upper lid portion of the first displacer 18*a*, and is connected to the first expansion chamber 32 through a working gas flow path 36*b* formed in the lower lid portion of the first displacer 18*a*. The second regenerator 28 is connected to the first regenerator 26 through a working gas flow path 36*c* formed from the lower lid portion of the first displacer 18*a* to the upper lid portion of the second displacer 18*b*. In addition, the second regenerator 28 is connected to the second expansion chamber 34 through a working gas flow path 36*d* formed in the lower lid portion of the second displacer 18*b*.

The working gas flow between the first expansion chamber 32, the second expansion chamber 34, and the room temperature chamber 30 is not the clearance between the cryocooler cylinder 16 and the displacer assembly 18, and a first seal 38*a* and a second seal 38*b* may be provided to be guided to the first regenerator 26 and the second regenerator 28. The first seal 38*a* may be mounted to the upper lid portion of the first displacer 18*a* to be disposed between the first displacer 18*a* and the first cylinder 16*a*. The second seal 38*b* may be mounted to the upper lid portion of the second displacer 18*b* to be disposed between the second displacer 18*b* and the second cylinder 16*b*.

As shown in FIG. 2, the expander 14 includes a cryocooler housing 20 that accommodates the pressure switching valve 40. The cryocooler housing 20 is coupled to the cryocooler cylinder 16, thereby configuring a hermetic container that accommodates the pressure switching valve 40 and the displacer assembly 18.

As shown in FIG. 3, the pressure switching valve 40 includes a high pressure valve 40*a* and a low pressure valve 40*b*, and is configured to generate periodic pressure fluctuations in the cryocooler cylinder 16. A working gas discharge port of the compressor 12 is connected to the room temperature chamber 30 via the high pressure valve 40*a*, and a working gas suction port of the compressor 12 is connected to the room temperature chamber 30 via the low pressure valve 40*b*. The high pressure valve 40*a* and the low pressure valve 40*b* are configured to be selectively and alternately opened and closed (that is, when one of the valves is open, the other of the valves is closed).

The pressure switching valve 40 may take the form of a rotary valve. That is, the pressure switching valve 40 may be configured such that the high pressure valve 40*a* and the low pressure valve 40*b* are alternately opened and closed by the rotational sliding of a valve disc with respect to a stationary valve main body. In that case, an expander motor 42 may be connected to the pressure switching valve 40 to rotate the valve disc of the pressure switching valve 40. For example, the pressure switching valve 40 is disposed such that a valve rotation shaft is coaxial with a rotation shaft of the expander motor 42.

Alternatively, the high pressure valve 40*a* and the low pressure valve 40*b* may be valves that can be individually controlled. In this case, the pressure switching valve 40 may not be connected to the expander motor 42.

The expander motor 42 may be, for example, a permanent magnet type motor that is driven by three-phase alternating current. The expander motor 42 is connected to a displacer drive shaft 44 via a motion conversion mechanism 43 such as a Scotch yoke mechanism, for example. The expander motor 42 is attached to the cryocooler housing 20. The motion conversion mechanism 43 is accommodated in the cryocooler housing 20 as with the pressure switching valve 40. The motion conversion mechanism 43 converts the rotary motion output by the expander motor 42 into a linear reciprocating motion of the displacer drive shaft 44. The displacer drive shaft 44 extends from the motion conversion mechanism 43 into the room temperature chamber 30, and is fixed to the upper lid portion of the first displacer 18*a*. The rotation of the expander motor 42 is converted into an axial reciprocation of the displacer drive shaft 44 by the motion conversion mechanism 43, and the displacer assembly 18 reciprocates linearly in the cryocooler cylinder 16 in the axial direction.

In FIG. 2, the electrical connection between the compressor 12 and the expander 14 in a normal cooling operation of the cryocooler 10 is shown. In the embodiment, the compressor 12 is connected to an external power source 46 such as a commercial power source (three-phase alternating-current power source), and electric power having a power source frequency (for example, 50 Hz or 60 Hz) is supplied from the external power source 46 to the compressor 12.

The compressor 12 is used as a power source for the expander 14. That is, the expander motor 42 is connected to the compressor 12 as a power source by a power supply cable 48, and can be driven at the power source frequency. The power supply cable 48 is, for example, a power supply line of AC 200 V. In the normal cooling operation of the cryocooler 10, the expander motor 42 is driven at a constant operation frequency equal to the power source frequency. Therefore, in the normal cooling operation, the frequency (the number of times per unit time) of the refrigeration cycle of the cryocooler 10 is constant. As will be described later, in a case where the expander motor 42 is connected to an inverter, the operation frequency of the expander motor 42 (and the frequency of the refrigeration cycle of the cryocooler 10) can be controlled by the inverter.

In addition, the cryocooler 10 includes a gas line 62 that circulates the working gas between the compressor 12 and the expander 14. The gas line 62 includes a high pressure line 63 connecting the compressor 12 to the expander 14 to supply the working gas from the compressor 12 to the expander 14, and a low pressure line 64 connecting the compressor 12 to the expander 14 to collect the working gas from the expander 14 to the compressor 12. The cryocooler housing 20 of the expander 14 is provided with a high pressure gas inlet 22 and a low pressure gas outlet 24. The high pressure gas inlet 22 of the expander 14 is connected to a high pressure gas outlet 50 of the compressor 12 by the high pressure line 63, and the low pressure gas outlet 24 of the expander 14 is connected to a low pressure gas inlet 51 of the compressor 12 by the low pressure line 64. Each of the high pressure line 63 and the low pressure line 64 may be a flexible pipe, a rigid pipe, or a combination thereof.

When the compressor 12 and the expander motor 42 are operated, the cryocooler 10 generates periodic volume fluctuations and pressure fluctuations of the working gas synchronized with the periodic volume fluctuations in the first expansion chamber 32 and the second expansion chamber 34. Typically, in an intake process, the low pressure valve **40*b* is closed and the high pressure valve 40*a* is opened, whereby the high pressure working gas flows from the compressor 12 into the room temperature chamber 30 through the high pressure valve 40*a*, is supplied to first expansion chamber 32 through the first regenerator 26, and is supplied to the second expansion chamber 34 through the second regenerator 28. In this manner, the first expansion chamber 32 and the second expansion chamber 34 are pressurized from the low pressure to the high pressure. In this case, the displacer assembly 18 is moved upward from the bottom dead center to the top dead center, and the volumes of the first expansion chamber 32 and the second expansion chamber 34 are increased. When the high pressure valve 40*a*** is closed, the intake process ends.

In an exhaust process, the high pressure valve **40*a* is closed and the low pressure valve 40*b* is opened, whereby the high pressure first expansion chamber 32 and the high pressure second expansion chamber 34 are opened to the low pressure working gas suction port of the compressor 12, and thus the working gas expands in the first expansion chamber 32 and the second expansion chamber 34. As a result, the low pressure working gas is discharged from the first expansion chamber 32 and the second expansion chamber 34 to the room temperature chamber 30 through the first regenerator 26 and the second regenerator 28. In this case, the displacer assembly 18 is moved downward from the top dead center to the bottom dead center, and the volumes of the first expansion chamber 32 and the second expansion chamber 34 are reduced. The working gas is collected from the expander 14 to the compressor 12 through the low pressure valve 40*b*. When the low pressure valve 40*b*** is closed, the exhaust process ends.

In this way, a refrigeration cycle such as a GM cycle, for example, is configured in the cryocooler 10, and the first cooling stage 33 and the second cooling stage 35 are cooled to a desired cryogenic temperature. The first cooling stage 33 is cooled to the first cooling temperature, and the second cooling stage 35 is cooled to the second cooling temperature lower than the first cooling temperature. By the cryocooler 10, the superconducting coil 102 is cooled to a cryogenic temperature equal to or lower than a critical temperature at which superconductivity is manifested. The superconducting coil 102 cooled to the cryogenic temperature can generate a desired high magnetic field by being supplied with power from a coil power source (not shown) disposed outside the vacuum vessel 106. In this way, the superconducting device 100 such as an MRI system is operated.

Typically, the superconducting device 100 can be continuously operated for a long period (for example, several months or several years or more) once the operation is started. After such a long-term normal operation, the superconducting device 100 and the cryocooler 10 may be inspected, or be subjected to maintenance such as repair or replacement as needed. Alternatively, although it is not desirable, even in a case where a failure or some abnormality occurs in the superconducting device 100 or the cryocooler 10, maintenance is performed.

During the maintenance, the operation of the superconducting device 100 is stopped, that is, the current supply to the superconducting coil 102 is stopped, and the cooling operation of the cryocooler 10 is also stopped. In the immersion cooling of the related art in which the superconducting coil 102 is immersed in a large amount of liquid helium and is cooled to a cryogenic temperature, even when the cryocooler 10 is stopped, the superconducting coil 102 can continue to be cooled by the liquid helium. Therefore, the cooling of the superconducting coil 102 can be maintained until the end of the maintenance, and thereafter, the operation of the superconducting device 100 can be promptly resumed.

In contrast, in the helium-saving cooling, the cryocooler 10 serves as a main (or only) cooling source. Therefore, unlike the immersion cooling, the superconducting coil 102 may be significantly heated by the input heat from the surrounding environment during the operation stop of the cryocooler 10. In that case, when the maintenance is ended, the superconducting coil 102 has to be re-cooled to a target cooling temperature by the cryocooler 10. A considerable time is required for the re-cooling although the time depends on the specifications such as the size or the weight of the superconducting device 100. It is not desirable that the downtime in which the superconducting device 100 cannot be used is prolonged. Therefore, in the embodiment, the accelerated cooling operation of the cryocooler 10 described below is proposed.

Figure 4:
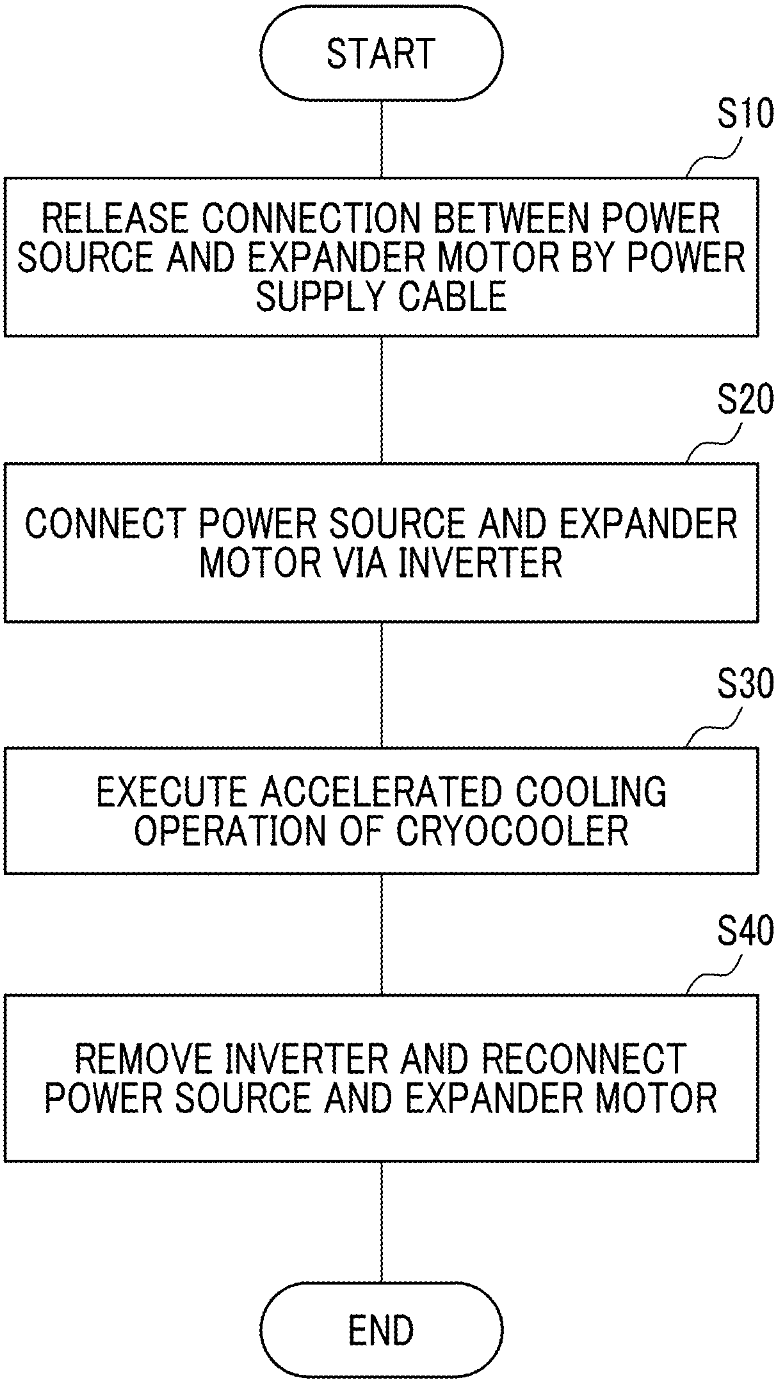
FIG. 4 is a flowchart illustrating a method for operating the cryocooler according to the embodiment.
Figure 5:
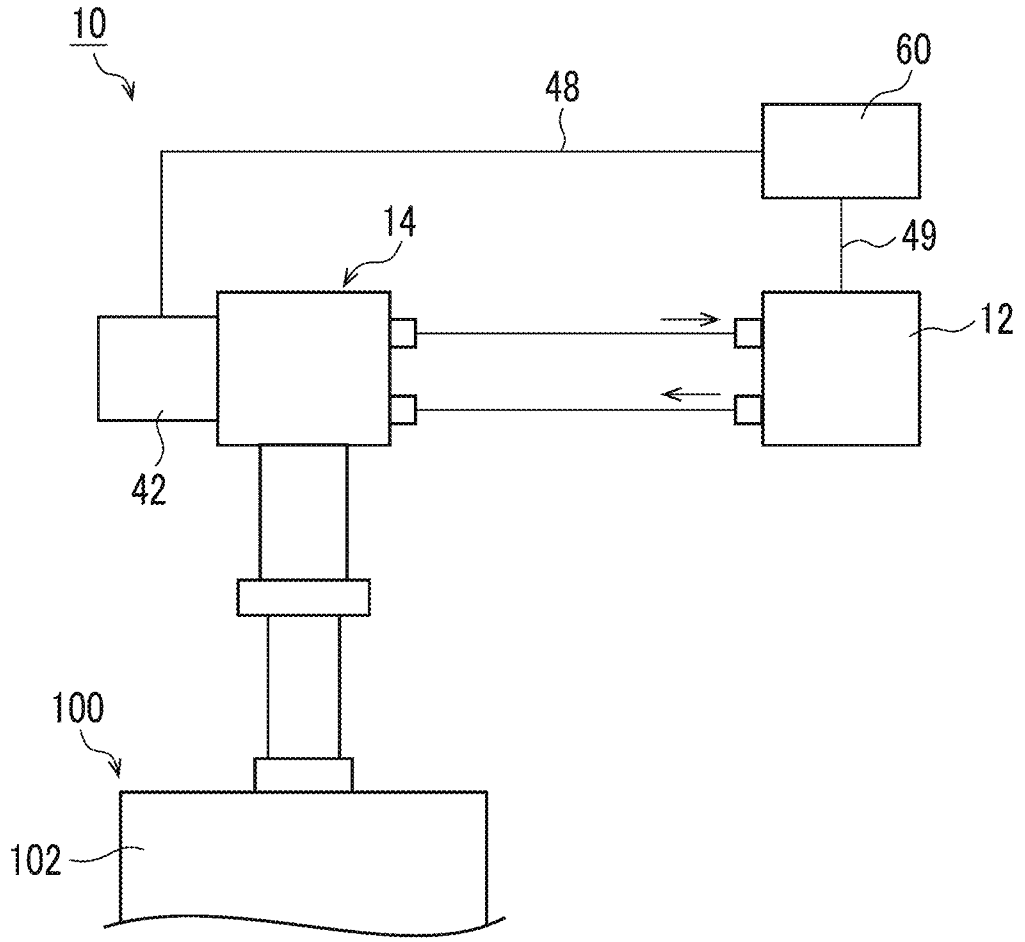
FIG. 5 is a diagram schematically showing an example of accelerated cooling operation of the cryocooler according to the embodiment.

FIG. 4 is a flowchart illustrating a method for operating the cryocooler 10 according to the embodiment. FIG. 5 is a diagram schematically showing an example of the accelerated cooling operation of the cryocooler 10 according to the embodiment.

The present method is performed after the end of the normal cooling operation of the cryocooler 10 described above. The present method may be performed after the end of the maintenance of the superconducting device 100 or the cryocooler 10, which is performed as necessary, after the end of the normal cooling operation.

In the present method, first, the connection between the power source (that is, the compressor 12) and the expander motor 42 by the power supply cable 48 is released (S10 in FIG. 4). For example, a worker such as a service engineer removes one end of the power supply cable 48 from a terminal of the compressor 12 and removes the other end of the power supply cable 48 from a terminal of the expander motor 42. In this way, the electrical connection between the compressor 12 and the expander motor 42 is once released.

Next, the power source (that is, the compressor 12) and the expander motor 42 are connected to each other via an inverter 60 (S20 in FIG. 4). The worker connects the expander motor 42 and the inverter 60 to each other by using the power supply cable 48. The worker connects one end of the power supply cable 48 to the terminal of the expander motor 42 again, and connects the other end of the power supply cable 48 to an output terminal of the inverter 60. In addition, the worker prepares an additional power supply cable 49, connects one end of the power supply cable 49 to an input terminal of the inverter 60, and connects the other end of the power supply cable 49 to a terminal of the compressor 12. In this way, as shown in FIG. 5, the electrical connection between the compressor 12 and the expander motor 42 is re-established via the inverter 60. The compressor 12 and the inverter 60 may be connected to each other by the original power supply cable 48, and the expander motor 42 and the inverter 60 may be connected to each other by the additional power supply cable 49.

The inverter 60 is configured to convert a power source frequency that is input (supplied) from the compressor 12 serving as a power source into an operation frequency higher than the power source frequency and output the electric power having the converted higher operation frequency to the expander motor 42. The inverter 60 may be configured to be capable of adjusting the operation frequency to be output. The operation frequency that is output from the inverter 60 may be selected from a frequency range higher than, for example, 50 Hz (or 60 Hz) and lower than, for example, 100 Hz. The operation frequency can be appropriately selected by the worker operating the inverter 60.

The inverter 60 may be mounted in a portable inverter box. The worker can easily bring the inverter 60 to the site, which is convenient. The inverter 60 may be disposed inside a casing of the inverter box, and an input terminal and an output terminal of the inverter 60 may be provided on the casing surface of the inverter box.

Subsequently, the accelerated cooling operation of the cryocooler 10 is executed (S30 in FIG. 4). When the cryocooler 10 is started, the power source frequency that is input from the compressor 12 to the inverter 60 through the power supply cable 48 is converted into a preselected operation frequency higher than the power source frequency by the inverter 60, and the converted operation frequency is output from the inverter 60 to the expander motor 42 through the power supply cable 49.

In this way, the expander motor 42 is driven at a higher operation frequency compared to the normal cooling operation of the cryocooler 10. Therefore, in the accelerated cooling operation, the cryocooler 10 is operated with a higher cooling capacity compared to the normal cooling operation. In this way, the cryocooler 10 can be rapidly cooled, and an object to be cooled, such as the superconducting coil 102, can be quickly cooled to a target cooling temperature.

In a case where the cooling temperature of the cryocooler 10 or the superconducting coil 102 can be identified on the spot, the worker may compare the cooling temperature with the target temperature while executing the accelerated cooling operation of the cryocooler 10. The accelerated cooling operation may be continued until the cooling temperature falls to the target temperature. The accelerated cooling operation may be stopped when the cooling temperature reaches the target temperature.

Alternatively, the cryocooler 10 may have a timer. The timer may be provided in the inverter 60. A time from the start to the end of the accelerated cooling operation may be set in advance in the timer, and the accelerated cooling operation may be automatically ended by the elapse of the setting time. The setting time may be set by the worker.

After the accelerated cooling operation is stopped, the inverter 60 is removed, and the power source (that is, the compressor 12) and the expander motor 42 are reconnected to each other (S40 in FIG. 4). The compressor 12 and the expander motor 42 may be connected to each other again by the power supply cable 48. The electrical connection between the compressor 12 and the expander 14 returns to the initial state shown in FIG. 2. In this way, the cryocooler 10 can resume the normal cooling operation.

Therefore, according to the embodiment, it is possible to provide a method for operating the cryocooler 10 that assists in the re-cooling of the object to be cooled such as the superconducting coil 102. The object to be cooled can be re-cooled to a desired cooling temperature in a short time by using the accelerated cooling operation of the cryocooler 10.

Figure 6:
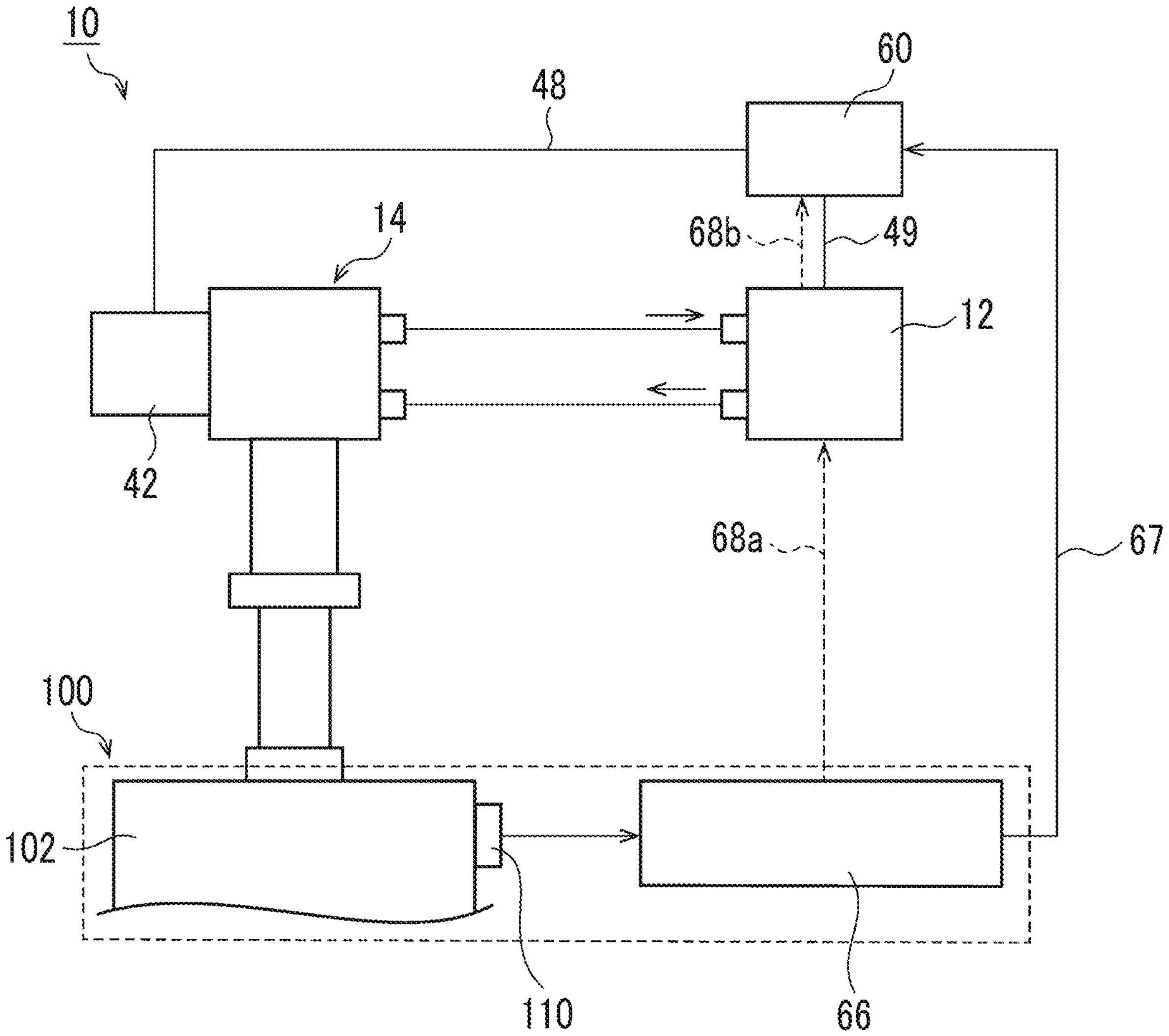
FIG. 6 is a diagram schematically showing another example of the accelerated cooling operation of the cryocooler according to the embodiment.

FIG. 6 is a diagram schematically showing another example of the accelerated cooling operation of the cryocooler 10 according to the embodiment. Similarly to the embodiment described above, in order to perform the accelerated cooling operation of the cryocooler 10, the compressor 12 serving as a power source is electrically connected to the inverter 60 by the power supply cable 49, and the inverter 60 is electrically connected to the expander motor 42 of the expander 14 by the power supply cable 48.

The inverter 60 may be controlled by a controller 66. That is, the controller 66 may be configured to generate a control signal instructing the end of the accelerated cooling operation of the cryocooler 10 and output the control signal to the inverter 60. The controller 66 may be communicably connected to the inverter 60 by a signal cable 67 for transmitting the control signal. The inverter 60 receives the control signal from the controller 66, whereby the accelerated cooling operation of the cryocooler 10 may be ended.

For example, the controller 66 may be a host controller that controls the superconducting device 100 (for example, the MRI system). The superconducting device 100 may include a temperature sensor 110 that is provided in the superconducting coil 102, measures the temperature of the superconducting coil 102, and outputs a measured temperature signal indicating the measured temperature of the superconducting coil 102 to the controller 66. The controller 66 may receive the measured temperature signal from the temperature sensor 110 and compare the cooling temperature of the superconducting coil 102 with a target temperature during the execution of the accelerated cooling operation of the cryocooler 10. In a case where the cooling temperature of the superconducting coil 102 is higher than the target temperature, the controller 66 may continue the accelerated cooling operation (that is, may not instruct the end of the accelerated cooling operation), and in a case where the cooling temperature of the superconducting coil 102 reaches the target temperature, the controller 66 may generate a control signal instructing the end of the accelerated cooling operation and output the control signal to the inverter 60.

As shown by a dashed line arrow in FIG. 6, the control signal instructing the end of the accelerated cooling operation may be given from the controller 66 to the inverter 60 via the compressor 12. The controller 66 may be connected to the compressor 12 by a signal cable 68*a*, and the compressor 12 may be connected to the inverter 60 by another signal cable 68*b*.

As an alternative, the controller 66 may be a cryocooler controller that controls the cryocooler 10, instead of the host controller that controls the superconducting device 100. The cryocooler controller may be mounted on the compressor 12.

The controller 66 is realized by elements or circuits such as a CPU or a memory of a computer as a hardware configuration, and is realized by a computer program or the like as a software configuration. However, in FIG. 6, the controller 66 is appropriately depicted as functional blocks which are realized by the cooperation of the hardware configuration and the software configuration. It will be understood by those skilled in the art that these functional blocks can be realized in various ways by combining hardware and software.

Figure 7:
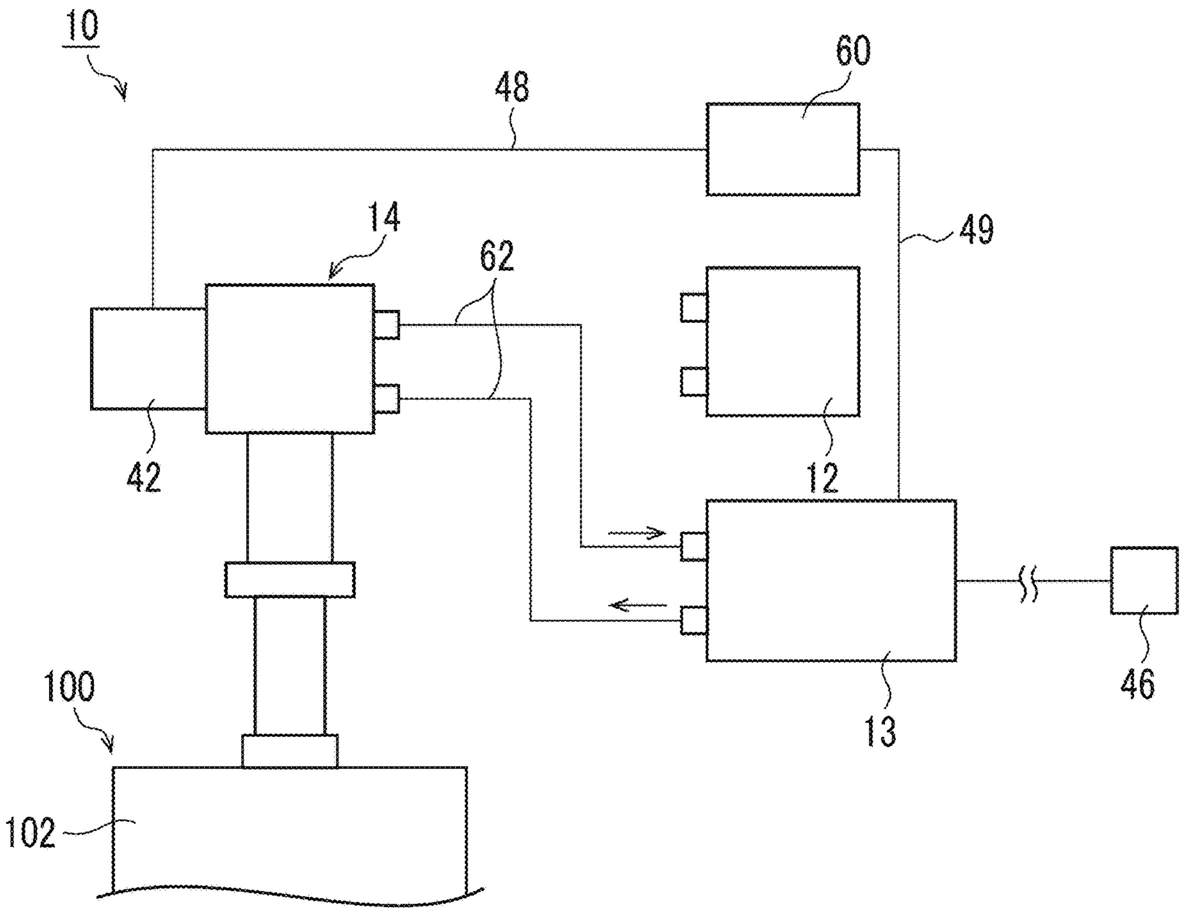
FIG. 7 is a diagram schematically showing another example of the accelerated cooling operation of the cryocooler according to the embodiment.

FIG. 7 is a diagram schematically showing another example of the accelerated cooling operation of the cryocooler 10 according to the embodiment. Instead of the compressor 12, the other compressor 13 having a larger capacity than the compressor 12 may be connected to the expander motor 42 via the inverter 60, as a power source, and may be used for the accelerated cooling operation of the cryocooler 10.

The other compressor 13 is connected to the external power source 46, and electric power having a power source frequency (for example, 50 Hz or 60 Hz) is supplied from the external power source 46 to the compressor 13. As for the electrical connection between the other compressor 13 and the expander 14, the inverter 60 is connected to the expander motor 42 by the power supply cable 48, and the compressor 13 is connected to the inverter 60 by the power supply cable 49. In addition, the gas line 62 is also removed from the compressor 12 and is connected to the other compressor 13.

In this way, the accelerated cooling operation of the cryocooler 10 may be performed using the other compressor 13 having a larger capacity than the compressor 12. In the accelerated cooling operation, more working gas can be supplied from the other compressor 13 to the expander 14 as compared with the normal cooling operation using the compressor 12. The superconducting coil 102 of the superconducting device 100 can be re-cooled to a desired cooling temperature in a short time by using the accelerated cooling operation of the cryocooler 10.

Figure 8:
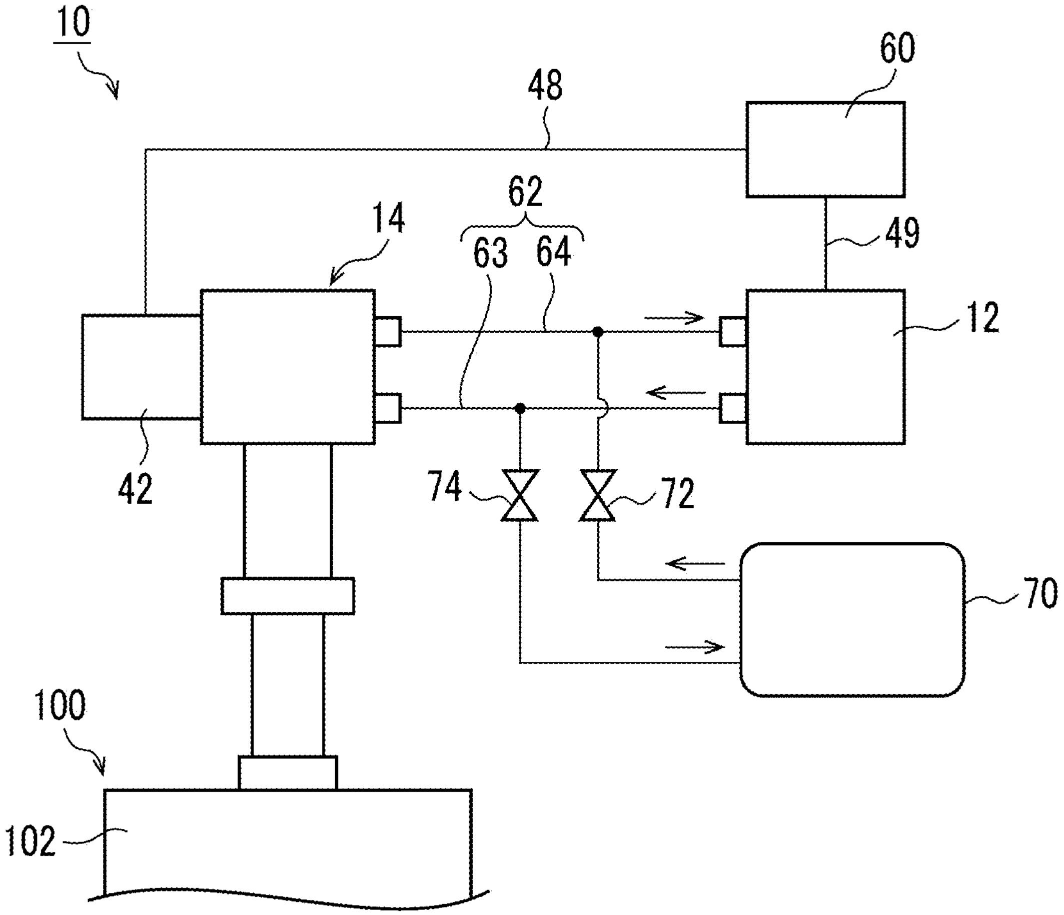
FIG. 8 is a diagram schematically showing another example of the accelerated cooling operation of the cryocooler according to the embodiment.

FIG. 8 is a diagram schematically showing another example of the accelerated cooling operation of the cryocooler 10 according to the embodiment. Similarly to the embodiment described above, in order to perform the accelerated cooling operation of the cryocooler 10, the compressor 12 serving as a power source is electrically connected to the inverter 60 by the power supply cable 49, and the inverter 60 is electrically connected to the expander motor 42 of the expander 14 by the power supply cable 48.

The method for operating the cryocooler 10 according to the embodiment may further include temporarily increasing the amount of the working gas of the cryocooler 10 during the execution of the accelerated cooling operation. In order to realize this, a buffer volume 70 may be connected to the gas line 62 of the cryocooler 10.

The buffer volume 70 is a volume for storing the working gas, and may be, for example, a buffer tank. The pressure of the buffer volume 70 may be an intermediate pressure (for example, an average pressure of the high pressure and the low pressure) between the pressure of the high pressure line 63 and the pressure of the low pressure line 64 during the operation of the cryocooler 10. A supply valve 72 connects the buffer volume 70 to the low pressure line 64, and a collection valve 74 connects the buffer volume 70 to the high pressure line 63. Each of the supply valve 72 and the collection valve 74 may be an on/off valve or a flow rate control valve, and may be an electromagnetic valve, for example.

Therefore, when the supply valve 72 is opened during the operation of the cryocooler 10, the working gas is supplied from the buffer volume 70 to the low pressure line 64 through the supply valve 72. When the supply valve 72 is closed, the supply of the working gas from the buffer volume 70 to the low pressure line 64 is stopped. Further, when the collection valve 74 is opened, the working gas is collected from the high pressure line 63 to the buffer volume 70 through the collection valve 74. When the collection valve 74 is closed, the collection of the working gas from the high pressure line 63 to the buffer volume 70 is stopped. In this way, the amount of the working gas circulating through the gas line 62 can be adjusted by opening and closing the supply valve 72 and the collection valve 74.

When the accelerated cooling operation of the cryocooler 10 is started, the supply valve 72 is opened, so that the working gas is supplied from the buffer volume 70 to the low pressure line 64, and the amount of the working gas circulating through the cryocooler 10 can be increased. In addition, when the accelerated cooling operation is ended, the collection valve 74 is opened, so that the working gas is collected from the high pressure line 63 to the buffer volume 70, and the amount of the working gas circulating through the cryocooler 10 can be restored.

In this way, the cooling capacity can be improved by temporarily increasing the amount of the working gas of the cryocooler 10 during the execution of the accelerated cooling operation, and it is possible to assist in the re-cooling of an object to be cooled, such as the superconducting coil 102.

Figure 9:
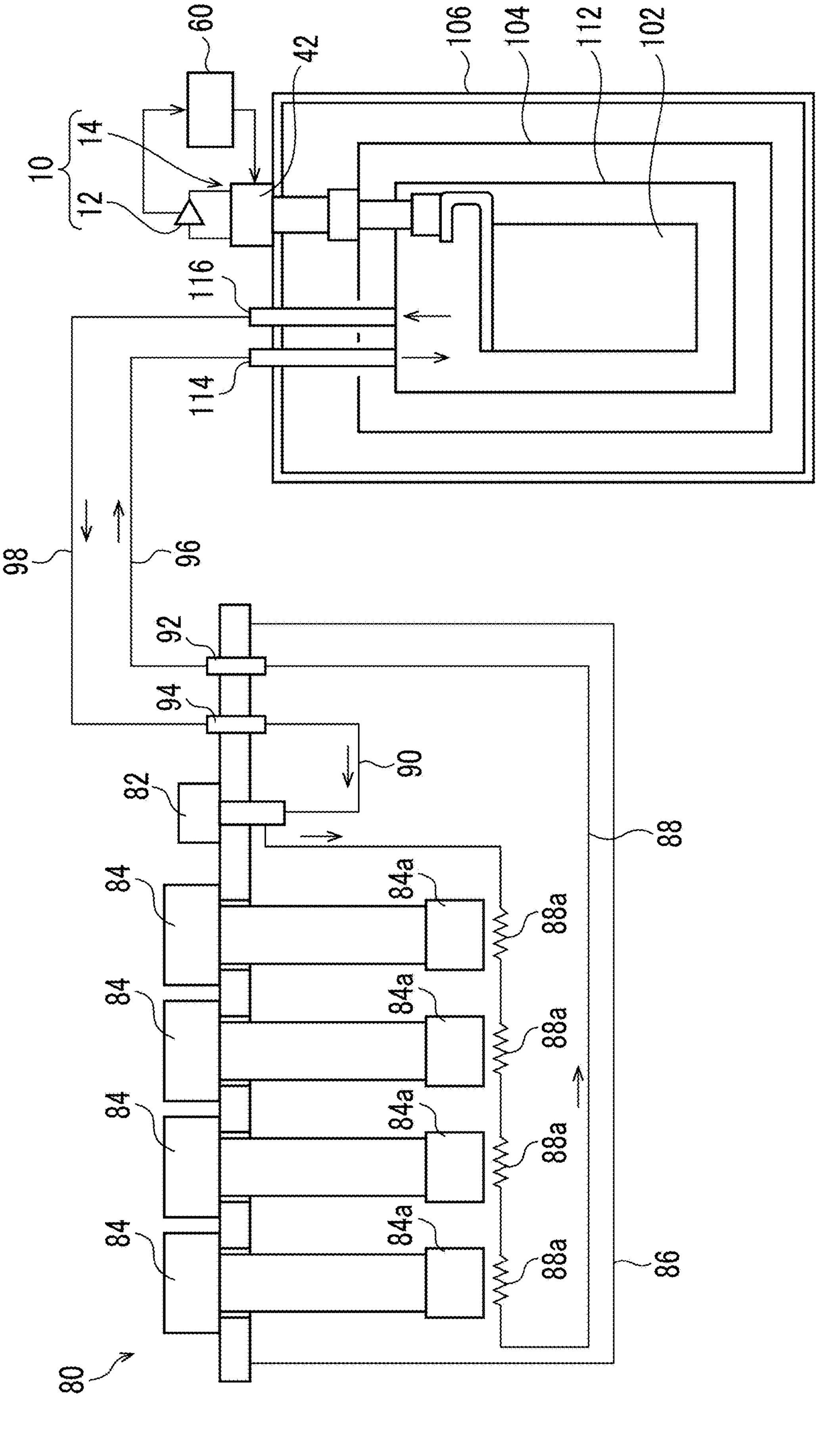
FIG. 9 is a diagram schematically showing another example of the accelerated cooling operation of the cryocooler according to the embodiment.

FIG. 9 is a diagram schematically showing another example of the accelerated cooling operation of the cryocooler 10 according to the embodiment. Similarly to the embodiment described above, the compressor 12 serving as a power source is electrically connected to the expander motor 42 of the expander 14 via the inverter 60 for the accelerated cooling operation of the cryocooler 10.

In addition to the accelerated cooling operation of the cryocooler 10, the superconducting coil 102 may be cooled by using an additional cooling device, for example, a circulation cooling device 80, which supplies a cooled gas to the periphery of the superconducting coil 102.

The circulation cooling device 80 is configured to cool a refrigerant gas to a cryogenic temperature and circulate the cooled refrigerant gas to the superconducting device 100. Although the refrigerant gas is a helium gas in the embodiment, other gases such as a nitrogen gas, for example, may be used in some cases. The circulation cooling device 80 includes a circulation device 82, at least one (in the embodiment, a plurality of, for example, four) cryocooler 84, a vacuum vessel 86, a supply line 88, and a collection line 90.

The circulation device 82 is configured to send the refrigerant gas collected from the collection line 90 to the supply line 88, thereby allowing the refrigerant gas to be circulated between the circulation cooling device 80 and the superconducting device 100. The circulation device 82 is installed inside the vacuum vessel 86. The circulation device 82 may be, for example, a fan. In addition, the circulation device 82 may be a compressor that is disposed in the surrounding environment (for example, a room temperature atmosphere) outside the vacuum vessel 86. The compressor may be a compressor different from the compressor 12 of the cryocooler 10. The refrigerant gas that is sent to the supply line 88 is pressurized to, for example, a pressure of 1 MPa or higher and 2 MPa or lower by the circulation device 82.

Each of the plurality of cryocoolers 84 includes a cooling stage 84*a* for cooling the refrigerant gas, and is installed at the vacuum vessel 86 such that the cooling stage 84*a* is disposed within the vacuum vessel 86. The cryocooler 84 may be, for example, a two-stage Gifford-McMahon (GM) cryocooler, similarly to the cryocooler 10 of the superconducting device 100. The cryocooler 84 may be a single stage type and can provide a cooling temperature (for example, a liquid nitrogen temperature) that is selected from a range of 100 K to 10 K, for example, to the cooling stage 84*a*.

The vacuum vessel 86 is an insulated vacuum vessel that provides a cryogenic vacuum environment inside, and is also called a cryostat. The supply line 88 and the collection line 90 are accommodated in the vacuum vessel 86 together with the cooling stage 84*a* of the cryocooler 84. The wall surface of the vacuum vessel 86 is provided with a refrigerant gas supply port 92 and a refrigerant gas collection port 94. The supply line 88 connects the circulation device 82 to the refrigerant gas supply port 92, and the collection line 90 connects the refrigerant gas collection port 94 to the refrigerant gas supply port 92.

The supply line 88 includes a heat exchanger 88*a* that cools the refrigerant gas by heat exchange with the cooling stage 84*a* of the cryocooler 84. The heat exchanger 88*a* is provided for each cooling stage 84*a*, and these heat exchangers 88*a* are connected in series.

The vacuum vessel 106 of the superconducting device 100 may be provided with a refrigerant container 112, a refrigerant inlet 114, and a refrigerant outlet 116. The refrigerant container 112 accommodates the superconducting coil 102 and is disposed to be surrounded by the heat shield 104 inside the vacuum vessel 106. The refrigerant inlet 114 is a supply port for the refrigerant gas from the outside of the vacuum vessel 106 to the refrigerant container 112, and the refrigerant outlet 116 is a collection port for the refrigerant gas from the refrigerant container 112 to the outside of the vacuum vessel 106.

When the accelerated cooling operation of the cryocooler 10 described above is performed, the circulation cooling device 80 is connected to the superconducting device 100 by a supply-side transfer line 96 and a collection-side transfer line 98. The supply-side transfer line 96 connects the refrigerant gas supply port 92 of the circulation cooling device 80 to the refrigerant inlet 114 of the superconducting device 100, and the collection-side transfer line 98 connects the refrigerant gas collection port 94 of the circulation cooling device 80 to the refrigerant outlet 116 of the superconducting device 100. The supply-side transfer line 96 and the collection-side transfer line 98 may be flexible tubes compatible with the refrigerant gas cooled to a cryogenic temperature.

When the circulation device 82 operates, the refrigerant gas sequentially passes through the plurality of heat exchangers 88*a* connected in series on the supply line 88, and is cooled by the cooling stage 84*a* of each of the cryocoolers 84. The refrigerant gas cooled to the cooling temperature of the cooling stage 84*a* in this way is supplied to the refrigerant container 112 of the superconducting device 100 through the supply-side transfer line 96, and cools the superconducting coil 102. The refrigerant gas is collected from the refrigerant container 112 to the collection line 90 of the circulation cooling device 80 through the collection-side transfer line 98, and is sent to the supply line 88 again by the circulation device 82. In the precooling of the superconducting device 100 using the circulation cooling device 80, a liquid refrigerant such as liquid nitrogen is not used.

By continuing such circulation of the refrigerant gas, the circulation cooling device 80 can cool the superconducting coil 102 of the superconducting device 100 to the cooling temperature of the refrigerant gas of the circulation cooling device 80. Thereafter, the operation of the circulation cooling device 80 is stopped, and the circulation cooling device 80 is removed from the superconducting device 100.

In this way, during the execution of the accelerated cooling operation, an additional cooling device, for example, the circulation cooling device 80 can be used in combination, so that it is possible to assist in the re-cooling of the object to be cooled, such as the superconducting coil 102.

The features described in connection with a certain embodiment may be combined with the features described in connection with another embodiment. For example, the use of the other compressor 13 referred to with reference to FIG. 7 may be used in combination with the buffer volume 70 referred to with reference to FIG. 8. Alternatively, the other compressor 13 may be used in combination with the circulation cooling device 80 referred to with reference to FIG. 9. The buffer volume 70 and the circulation cooling device 80 may be used in combination.

The present invention has been described above based on the examples. It will be understood by those skilled in the art that the present invention is not limited to the above embodiments, various design changes can be made, various modification examples are possible, and such modification examples are also within the scope of the present invention. Various features described in relation to a certain embodiment are also applicable to other embodiments. New embodiments resulting from combinations have the effect of each of embodiments which are combined.

In the embodiment described above, the compressor 12 is used as the power source of the expander 14. However, this is not essential. In a certain embodiment, the expander 14 may be connected to the external power source 46 without passing through the compressor 12, and may be supplied with power from the external power source 46.

In the embodiment described above, a case where the cryocooler 10 is a two-stage GM cryocooler was described as an example. However, there is no limitation thereto. The cryocooler 10 may be a single-stage or multi-stage GM cryocooler, and may be a pulse tube cryocooler, a Stirling cryocooler, or other types of cryocoolers. Similarly, the cryocooler 84 is also not limited to the GM cryocooler, and may be a pulse tube cryocooler, a Stirling cryocooler, or other cryocoolers.

In the embodiment described above, a case where the superconducting device 100 is mounted in the MRI system has been described as an example. However, there is no limitation thereto. The superconducting device 100 may configure a part of, for example, a single crystal pulling device, an NMR system, an accelerator such as a cyclotron, a high-energy physical system such as a nuclear fusion system, or other equipment that utilizes a high magnetic field.

The present invention has been described above based on the examples. It will be understood by those skilled in the art that the present invention is not limited to the above embodiments, various design changes can be made, various modification examples are possible, and such modification examples are also within the scope of the present invention.

The present invention can be used in the field of a method for operating a cryocooler.

It should be understood that the invention is not limited to the above-described embodiment, but may be modified into various forms on the basis of the spirit of the invention. Additionally, the modifications are included in the scope of the invention.

What is claimed is:

1. A method for operating a cryocooler, in which the cryocooler includes an expander including an expander motor that is connected to a power source by a power supply cable and is capable of being driven at a power source frequency, the method comprising:

releasing a connection between the power source and the expander motor by the power supply cable;

connecting the power source and the expander motor via an inverter;

executing an accelerated cooling operation of the cryocooler in which the power source frequency is converted into an operation frequency higher than the power source frequency by the inverter and the expander motor is driven at the converted operation frequency; and removing the inverter and reconnecting the power source and the expander motor, after the accelerated cooling operation is stopped.

2. The method according to claim 1, wherein the cryocooler includes a first compressor for suctioning and discharging a working gas to and from the expander, and the first compressor is connected to the expander motor by the power supply cable as the power source.

3. The method according to claim 2, wherein the connecting includes replacing the first compressor with a second compressor having a larger capacity than the first compressor, wherein the second compressor is connected to the expander motor via the inverter as the power source, and is used for the accelerated cooling operation.

4. The method according to claim 1, further comprising:

temporarily increasing an amount of a working gas of the cryocooler during the execution of the accelerated cooling operation.

5. The method according to claim 1, wherein the cryocooler is used for cooling of a superconducting coil, and the superconducting coil is cooled by using an additional cooling device that supplies a cooled gas to a periphery of the superconducting coil, in addition to the accelerated cooling operation.

6. The method according to claim 1, further comprising:

before the releasing the connection between the power source and the expander motor by the power supply cable, executing a normal cooling operation of the cryocooler that drives the expander motor at the power source frequency; and ending the normal cooling operation.

* * * * *